(12) United States Patent
Mandell et al.

(10) Patent No.: US 6,374,204 B1
(45) Date of Patent: *Apr. 16, 2002

(54) TRANSISTOR AMPLIFIER MODEL AND CIRCUIT ANALYSIS METHODS

(75) Inventors: Michael I. Mandell; Arnold L. Berman, both of Los Angeles; Wei-Chun Wang, Temple City; Tong-Jyh Lee, Hermosa Beach, all of CA (US)

(73) Assignee: Hughes Electronics Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,762

(22) Filed: Feb. 18, 1998

(51) Int. Cl.$^7$ .............................. G06F 17/50; G06N 7/00
(52) U.S. Cl. ................................. 703/14; 703/18; 703/2
(58) Field of Search ....................... 395/500.34, 500.35, 395/500.05; 703/14, 18, 2

(56) References Cited

U.S. PATENT DOCUMENTS

| | | | | |
|---|---|---|---|---|
| 4,791,593 A | * | 12/1988 | Hennion | 395/500.35 |
| 4,918,643 A | * | 4/1990 | Wong | 703/4 |
| 5,047,971 A | * | 9/1991 | Horwitz | 395/500.35 |
| 5,687,355 A | * | 11/1997 | Joardar et al. | 716/20 |

OTHER PUBLICATIONS

Yeager et al., "Improvement in norm–reducing Newton methods for circuit simulation," Computer Aided Design of Integrated Circuits and Systems, IEEE Transaction, vol. 8, No. 5, 1989, pp. 538–546.*

Trajkovic et al., "Finding DC operating points of transistor circuits using homotopy methods," Circuits and Systems, IEEE Int. Symp., 1991, pp. 758–761.*

* cited by examiner

*Primary Examiner*—Kyle Choi
(74) *Attorney, Agent, or Firm*—Terje Gudmestad

(57) ABSTRACT

A unique transistor model and methods for analyzing the model are disclosed. The transistor model of the present invention is simple and requires specification of a minimal number of parameters to simulate transistor operation. Three analysis methods are disclosed, each having unique circumstances for application A first method is premised on sampling all waveforms in the circuit and determining the operating point of the transistor. The first method assumes an input of an arbitrary periodic waveform. The first method is very flexible and may be used with a wide range of models other than the disclosed model. A second and a third method are premised on input and output waveform clipping. The second method assumes a single tone input into the transistor. The third method is a combination of features from the first and second methods. The third method is computationally efficient and assumes an arbitrary periodic input waveform.

8 Claims, 8 Drawing Sheets

TRANSISTOR AMPLIFIER MODEL AND CIRCUIT ANALYSIS METHODS

COMPUTER PROGRAM LISTING APPENDIX

The present application includes a computer program listing appendix comprising a total of 2 compact disks each containing identical copies of the programs which are included herewith. The computer program listing appendix has the following files which are hereby incorporated by reference:

| | | |
|---|---|---|
| Algl.c | 44KB C File | 6/3/97 11:50 AM |
| Build_cl | 1KB File | 6/3/97 11:59 AM |
| Dcomplex.c | 4KB C File | 6/3/97 11:57 AM |
| Dcomplex.h | 1KB H File | 6/3/97 11:57 AM |
| Fft4f.c | 26KB C File | 6/3/97 11:53 AM |
| Fft4f.h | 1KB H File | 6/3/97 11:54 AM |
| Ffz.c | 2KB C File | 6/3/97 11:54 AM |
| Ffz.h | 1KB H File | 6/3/97 11:54 AM |
| M_inv0d.c | 8KB C File | 6/3/97 11:55 AM |
| M_inv0d.h | 1KB H File | 6/3/97 11:55 AM |
| Nrutil.c | 5KB C File | 6/3/97 11:55 AM |
| Nrutil.h | 4KB H File | 6/3/97 11:55 AM |
| Read_one.c | 2KB C File | 6/3/97 11:55 AM |
| Read_one.h | 1KB H File | 6/3/97 11:56 AM |
| Read_two.c | 3KB C File | 6/3/97 11:56 AM |
| Read_two.h | 1KB H File | 6/3/97 11:56 AM |
| Write_on.c | 2KB C File | 6/3/97 11:57 AM |
| Write_on.h | 1KB H File | 6/3/97 11:57 AM |
| Wtcz.c | 2KB C File | 6/3/97 11:54 AM |
| Wtcz.h | 1KB H File | 6/3/97 11:54 AM |
| Alg2.c | 190 KBC File | 6/3/97 12:02 PM |
| Alg3.c | 201 KBC File | 6/3/97 12:03 PM |

BACKGROUND OF THE INVENTION (a) Field of the Invention

The present invention pertains to high power transistor amplifiers and, more particularly, to a transistor model and circuit analysis methods therefor.

(b) Description of Related Art

Communication systems utilize a wide range of transmission equipment for establishing communication links. Specifically, most communication systems utilize power amplifiers to boost a signal to an acceptable power level for transmission. Often these amplifiers are based on discrete semiconductor components such as transistors.

The design of high power transistor amplifiers is often simulation-based. Simulation packages can be used to calculate transistor output voltage and current (e.g., drain voltage and drain current). The calculation of output voltages and currents makes it possible to determine a wide variety of other circuit characteristics such as circuit gain, frequency response, and efficiency The use of simulation packages allows designers to test their designs without physically constructing them, thereby saving material cost and the designer's time. Currently, many software packages are available for simulating transistor amplifier circuit operation. These simulation packages are typically based on detailed transistor models such as the Pi parameter model or the Curtis model, which are very detailed and require the specification of many parameters for their use. Due to the complexity of these models, the simulation speeds of software packages using these models are relatively slow. Furthermore, it is difficult for a circuit designer using simulations to gain insight into the amplifier's operation because these models are very complex. That is, it is difficult for the designer to see how design changes alter circuit performance.

The need for a simple transistor model and methods for determining the output characteristics of a transistor can be readily appreciated. Such a model and its associated methods would allow the designer to quickly simulate amplifier designs. A simple model with simulation methods would also provide the designer with a sense of how design changes directly effect circuit performance.

SUMMARY OF THE INVENTION

A unique transistor model and methods for analyzing the model are disclosed. The transistor model of the present invention is simple and requires specification of a minimal number of parameters to determine the output characteristics of a transistor. Three analysis methods are disclosed, each having unique circumstances for application. A first method is premised on sampling all waveforms in the circuit and using the sampled information to determine the output of the transistor. The first method assumes an arbitrary periodic input waveform. The first method is very flexible and may be used with a wide range of models other than the disclosed model. A second and a third method are premised on input and output waveform clipping. The second method, which is computationally efficient, assumes a single tone input into the transistor. The third method is a combination of features from the first and second methods. That is, the third method is computationally efficient and assumes an arbitrary periodic input waveform.

A method for performing analysis of a non-linear circuit having known circuit characteristics and a known circuit input value is disclosed. The method includes the steps of generating an output value estimate; calculating an initial output value based on the circuit characteristics, the input value and the output value estimate; calculating a convergence factor based on a difference between the output value estimate and the initial output value; testing the convergence factor to determine whether the output value estimate and the initial output value have converged; generating a recursion factor that is used to update the output value estimate; and substituting the updated output value estimate for the output value estimate. The steps of the method are iterated until the output value estimate and the initial output value are sufficiently similar.

The present invention may also be embodied in a processor having an input port for accepting input data and an output port for providing output data. The processor may be programmed to perform analysis of a non-linear circuit having known circuit characteristics and a known circuit input value. The processor includes means for generating an output value estimate; means for calculating an initial output value based on the circuit characteristics, the input value and the output value estimate; means for calculating a convergence factor based on a difference between the output value estimate and the initial output value; means for testing the convergence factor to determine whether the output value estimate and the initial output value have converged; and means for generating a recursion factor. The processor may also include means for updating the output value estimate using the recursion factor; and means for substituting the updated output value estimate for the output value estimate.

In an alternate embodiment the processor be programmed to generate a first estimate of times at which the transistor changes from a first operating region to a second operating region. The processor may also calculate times at which the transistor changes from the second operating region to the first operating region. The processor may compute an intermediate value based on the first estimate of times and a second estimate or the times, using the intermediate value. The processor may be further programmed to compare the first estimate to the second estimate to determine whether the estimates have converged and replace the first estimate with the second estimate. The processor may be programmed to iterate the disclosed functionality until the first estimate and the second estimate converge. After convergence is reached the processor may generate an output result based on the intermediate value.

Also disclosed is a method for modeling a transistor including the step of representing a drain current as a linear component, a step function, and a scaling factor.

The invention itself, together with further objects and attendant advantages, will best be understood by reference to the following detailed description, taken in conjunction with the accompanying drawings.

DESCRIPTION OF THE PREFERRED EMBODIMENT

Figure 1A:
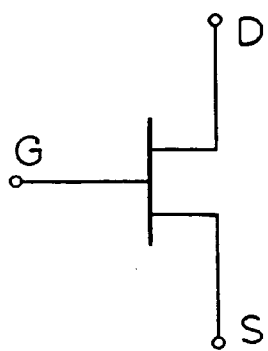
FIGS. 1A and 1B represent the schematic symbol and simplified model for a field effect transistor.
Figure 1B:
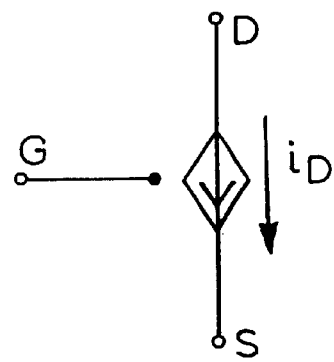
Figure 1C:
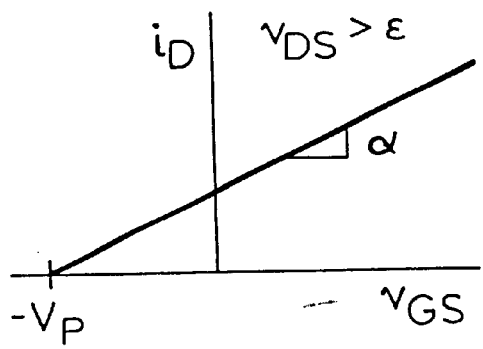
FIGS. 1C and 1D represent simplified input and output transistor characteristics of the present invention.
Figure 1D:
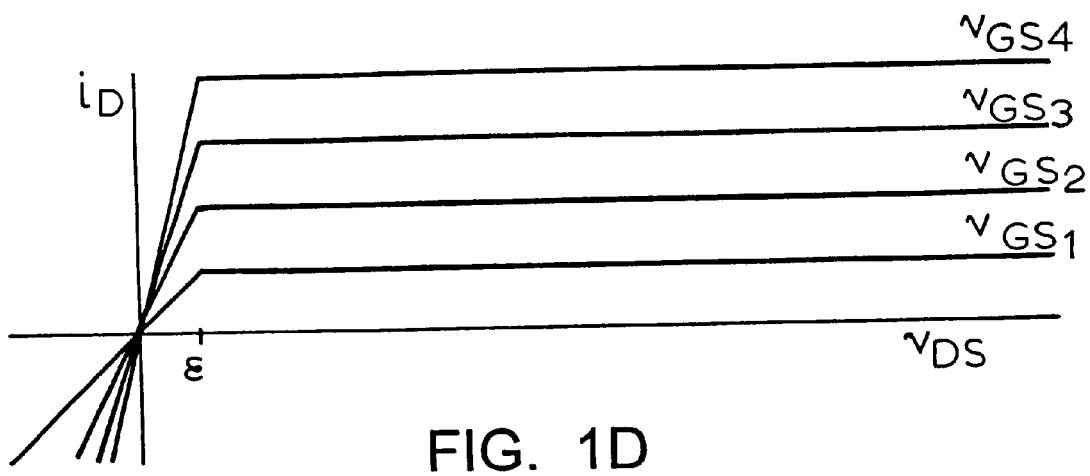

Referring now to the figures, FIGS. 1A and 1B represent the schematic symbol and a simplified model for a transistor. In each case note that the gate, the drain and the source are denoted by G, D, and S, respectively. The simplified model as shown in FIG. 1B models the transistor as a dependent current source having drain current $i_D$ dependent on the voltage between the drain and the source and the voltage between the gate and the source ($v_{DS}$ and $v_{GS}$). FIG. 1C represents the drain current $i_D$ as a function of the gate to source voltage $v_{GS}$. The slope of the drain current $i_D$ is represented by $\alpha$, which is the gate voltage to drain current transconductance. The x-intercept of the drain current plot is the gate pinch-off voltage $V_P$, which represents an input level below which no input current will flow. Note that the characteristic as shown in FIG. 1C is dependent on the drain-to-source voltage being greater than $\epsilon$, where $\epsilon$ represents the threshold value of $v_{DS}$ below which the drain current does not remain constant. FIG. 1D is a family of curves which represent the drain current for various values of gate-to-source voltages ($v_{GS}$).

Figure 2:
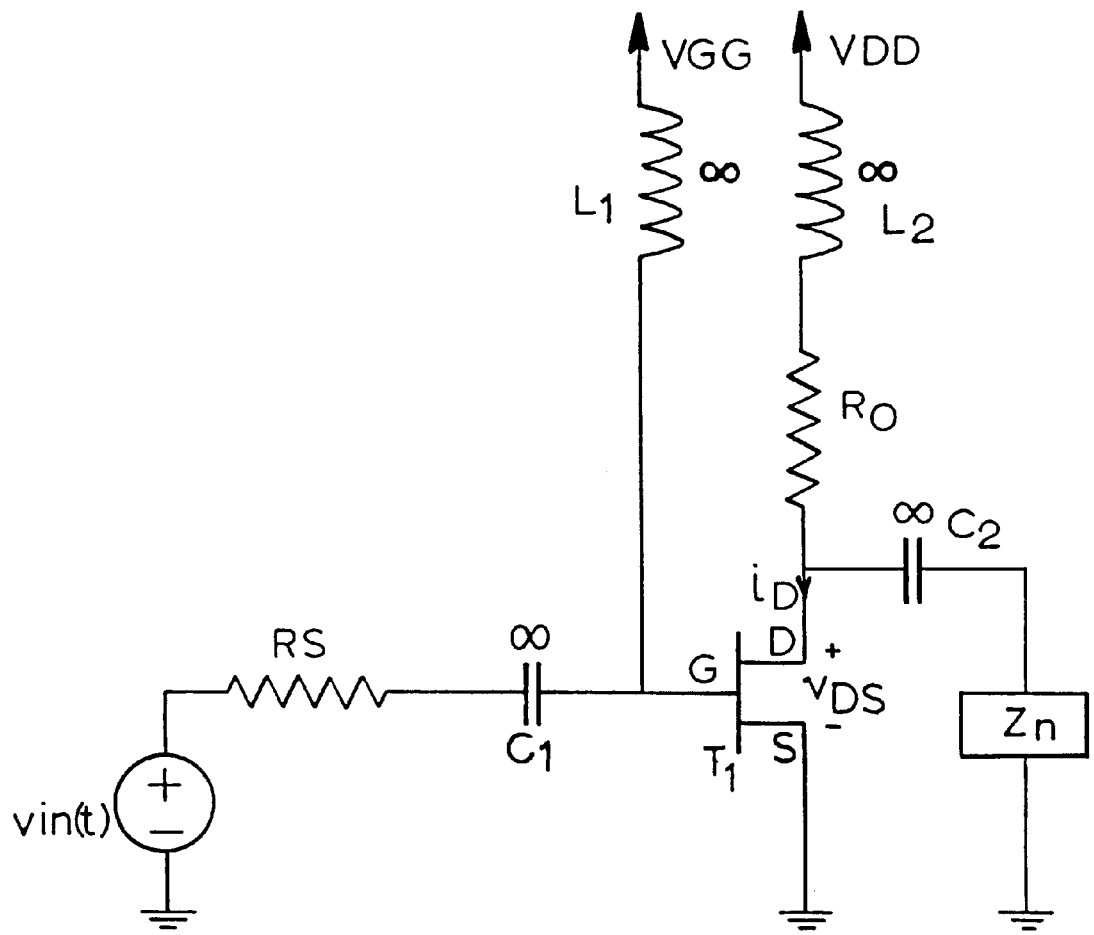
FIG. 2 is a schematic representation of a transistor circuit that is the object of the model and methods of the present invention.

FIG. 2 represents a transistor circuit used to illustrate the model and methods of the present invention. $V_{GG}$ and $V_{DD}$ represent DC voltage sources used to bias the gate and the drain of transistor T1. The DC voltage sources are coupled to a gate G and a drain D of the transistor T1 through inductors L1 and L2, which isolate the DC sources from RF signals. L1 and L2 are assumed to have infinite inductance, thereby allowing DC voltage to pass and choking RF signals. $v_{in}(t)$ and Rs represent the equivalent circuit of a source used to supply input signals to the transistor T1. Capacitors C1 and C2 are coupling capacitors used to couple RF energy to and from the transistor T1. For simulation purposes the capacitors are assumed to have infinite capacitance, thereby providing ideal DC isolation and RF coupling. The impedance $Z_n$ represents a complex load impedance at frequency n, which can be expressed as having a real component and an imaginary component as shown in Equation 1, wherein the real component of the impedance is represented by $R_n$ and the imaginary component is represented by $X_n$.

$$Z_n = R_n + jX_n \quad (1)$$

As shown in FIG. 2, the drain D of the transistor T1 also sees an equivalent real-valued output impedance of $R_O$ when operating at DC steady state.

The drain current $i_D$, as a function of time t, can be represented by Equation 2.

$$i_D(t) = \alpha [V_P + v_{GS}(t)] u[V_P + v_{GS}(t)] s_\epsilon(v_{DS}(t)) \quad (2)$$

Drain current ($i_D$), as represented in Equation 2, comprises three major components. The first component is a linear component that is a function of the pinch-off voltage and the gate-to-source voltage multiplied by the transconductance factor ($\alpha$). The second component is a step function, a(x), which is dependent on the sum of the pinch-off voltage and the gate-to-source voltage. As shown in Equation 3, u(x) is equal to 1 when x is greater than 0 and equal to 0 otherwise. The third component of Equation 2 is a scaling factor which considers situations when the drain-to-source voltage is less than the threshold value below which the drain current does not remain constant. The first two components of Equation 2 may be combined and referred to as $i_0(t)$.

Equation 4 defines the behavior of the scaling component as a function of x. Specifically, when x is greater than or equal to $\epsilon$, $s_\epsilon(x)$ equals 1. Alternatively, when x is less than $\epsilon$, $s_\epsilon(x)$ is equal to the ratio of x to $\epsilon$. Therefore, the third component of Equation 2 is equal to 1 when $v_{DS}$ is greater than or equal to the threshold $\epsilon$, otherwise the third component is equal to the ratio of $v_{DS}$ to $\epsilon$.

$$u(x) = \begin{cases} 1 & x > 0, \\ 0 & \text{otherwise} \end{cases} \quad (3)$$

$$s_\epsilon(x) = \begin{cases} 1 & x \geq \epsilon \\ \dfrac{x}{\epsilon} & x < \epsilon \end{cases} \quad (4)$$

Figure 3:
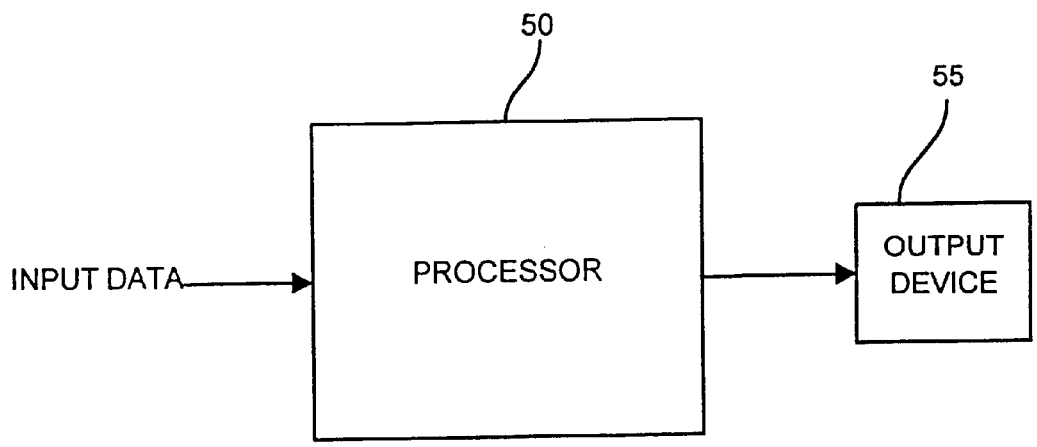
FIG. 3 is a representation of a hardware system that may employ the model and methods of the present invention.

Having set forth the amplifier model of the present invention, attention will now be turned toward three methods that can be used to determine transistor drain current and transistor voltage between the drain and source terminals. FIG. 3 represents the physical hardware on which the model and the method of the present invention may be implemented. The hardware configuration generally includes a processor 50 and an output device 55. The processor 50 is programmed to execute the steps of the methods of the present invention. The processor 50 may embody any suitable computation device such as a personal computer, a workstation, a distributed computing network or a digital signal processor. Input data is input to the processor using any standard technique (e.g., keyboard, scanner, data file, etc.). The processor 50 uses the input data to calculate the output voltages and currents of an amplifier circuit. After the output voltages and currents are calculated, the processor 50 outputs the results to the output device 55, which may include a video monitor, a printer or an output data file.

Method 1

Method 1 of the present invention simulates the behavior of the model amplifier of FIG. 2 using an iterative technique that generates a computationally efficient recursion matrix. The method is particularly versatile in that it can be readily modified to simulate a wide range of non-linear transistor models, including, for example, the Curtis model.

In particular, method 1 employs an iterative technique to solve for the drain current, the drain to source voltage and the output current of the model amplifier for a given arbitrary periodic input voltage, $v_{in}(t)$. As an overview, some of the method steps will be iterated m times, where m represents the number of iterations required to converge to acceptable simulation results. During each iteration of the method, an estimated frequency domain value for the drain current represented by a vector I will be generated. The estimated drain current vector I is then used to calculate a new frequency domain value of drain current represented by a vector F(I). Next, an iterative technique is employed to recursively adapt the estimate of the drain current until the estimated and calculated values for the drain current converge. Thus, the goal of method 1 is to solve for F(I)=I. Lastly, a parameter $\eta$, is computed to determine whether the method has sufficiently converged, such that F(I)=I. In the event that convergence has occurred, the value of I for the present iteration is used to calculate the values of the drain current, the drain to source voltage and the output current of the model amplifier.

To aid in describing the basis for the method operations, several relationships and definitions are introduced. For example, the vector I represents the harmonic components of the drain current, and, as described earlier, an estimate of I is generated during each iteration of the method and is referred to as I(m). The vector I is defined to be a real valued 2N+1 dimensional vector, as shown in Equation 101.

$$I_k = \begin{cases} \frac{1}{M}\sum_{n=0}^{M-1} I_n \cos\left(\frac{2\pi nk}{M}\right) & k = 0, 1, \ldots, N \\ -\frac{1}{M}\sum_{n=0}^{M-1} I_n \sin\left(\frac{2\pi n(k-N)}{M}\right) & k = N+1, N+2, \ldots, 2N \end{cases} \quad (101)$$

Wherein $I_n$ is defined to be a vector composed of M elements that represent samples of the drain current, $i_D$, taken over a single period of the waveform as shown in Equation 103.

$$I_n = i_D\left(\frac{2\pi n}{M}\right), (n = 0, 1, \ldots, M-1) \quad (103)$$

To enable operations in both the time and frequency domain, the vector I may be represented as the Fourier transform of the vector I such that I=FT(I).

Similarly, the inverse Fourier transform of I yields I such that I=TF(I). Where I is represented by Equation 105.

$$\mathcal{I}_n = I_0 + 2\sum_{k=1}^{N}\left[I_k \cos\left(\frac{2\pi nk}{M}\right) - I_{N+k}\sin\left(\frac{2\pi nk}{M}\right)\right], (n = 0, 1, \ldots, M-1) \quad (105)$$

The characteristic equation of Equation 2 is used to calculate the value of F(I). As shown earlier in Equation 2, the characteristic equation relates the drain current to various transistor voltages and comprises three major components.

Since $\alpha$ and $V_P$ are known for a given transistor and since the gate to source voltage $v_{GS}(t)$ may be sampled, the first and second components are determined using substitution of the proper variables into Equation 2 to obtain $i_0(t)$. However, determination of the third component, $s_\epsilon(v_{DS}(t))$, is less trivial because the drain to source voltage is dependent upon the unknown drain current. Method 1 of the present invention solves for the drain to source voltage, $v_{DS}(t)$, by estimating the value of the drain current and then using this estimate to calculate the drain to source voltage. Finally, $v_{DS}(t)$ is used to determine $s_\epsilon(v_{DS}(t))$, which is then multiplied by $i_0(t)$ to obtain the drain current, F(I). Next, an iterative technique is employed to recursively adapt the estimate of the drain current until the estimated and calculated values for the drain current converge such that F(I)=I.

Note that prior to executing method 1, it is assumed that a periodic, arbitrary input voltage waveform is applied to the model amplifier and that the following model variables are known:

N=the number of harmonics used in the simulation;

M=the number of samples collected for each waveform;

$\alpha$=the gate voltage to drain current transconductance (A/V);

$V_P$=the gate pinch-off voltage;

$\epsilon$=the threshold value below which the drain current does not remain constant;

$R_0$=the DC resistance at the drain of the transistor;

$Z_n$=the complex impedance at frequency n, specified over the range n=1, 2, . . . , N;

$V_{DD}$=the DC drain bias voltage;

$V_{GG}$=the DC gate bias voltage; and $\eta_{th}$=the threshold value used to determine convergence of method 1.

As previously mentioned, this information may be input to the processor that is executing the method of the present invention by a number of different methods.

It is further assumed that the gate to source voltage, $v_{GS}$, is sampled M times over a single period of the input voltage, $v_{in}(t)$. To ensure accurate results, the sample size must exceed the Nyquist value. Note, however, that although a larger sample size will yield greater accuracy, an increase in the number of sampled values will adversely affect processing speed.

Figure 4:
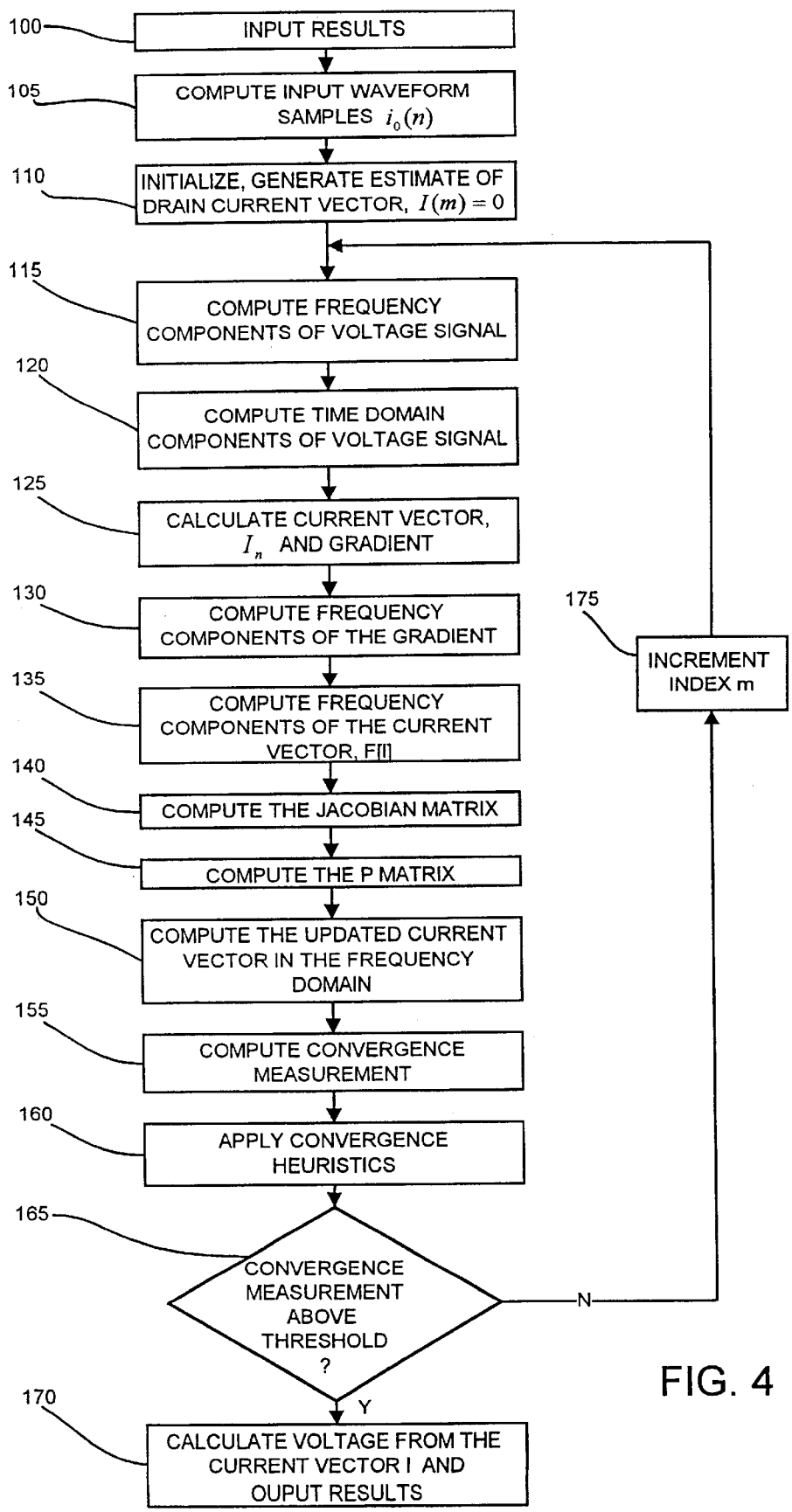
FIG. 4 is a flow diagram representing the first method of the present invention.

Referring to the flow diagram of FIG. 4, method 1 begins at a block 100 where the sampled $v_{GS}$ values and all of the known model variables specified above are input to a processor programmed to perform the steps of method 1. Thereafter, control passes to a block 105 that uses the sampled $v_{GS}$ voltage values, $V_P$ and $\alpha$ to compute the current waveform samples $i_0(n)$ defined by Equation 107.

$$i_0(n) = \alpha \left[ V_P + v_{GS}\left(\frac{2\pi n}{M}\right) \right] u \left[ V_P + v_{GS}\left(\frac{2\pi n}{M}\right) \right], \quad (107)$$

$$(n = 0, 1, \ldots, M-1)$$

Note that the vector $i_0(n)$ represents the drain current for the region of the characteristic curve in which $v_{DS}$ is greater than or equal to $\epsilon$. The resulting vector $i_0(n)$ will be substituted into the characteristic equation (Equation 2) in subsequent method blocks to calculate the value of F(I).

Control then passes to a block 110, which initializes a method iteration counter (represented by the variable m) to zero and also initializes the first estimate of the drain current I(m) equal to zero.

At a block 115 a vector V representative of the frequency components of the drain to source voltage, $v_{DS}$, is determined using the estimated value of I. The vector V is used in subsequent steps to calculate the drain current F(I). In particular, block 115 calculates the vector V by multiplying the estimated value of the drain current, I(m), by the output impedance $Z_k$ according to Equation 109.

$$V_k = \begin{cases} V_{DO} & k = 0 \\ -\text{Re}\{Z_k\}I_k + \text{Im}\{Z_k\}I_{k+N} & 1 \leq k \leq N \\ -\text{Im}\{Z_k\}I_k - \text{Re}\{Z_k\}I_{k+N} & N+1 \leq k \leq 2N \end{cases} \quad (109)$$

Control then passes to a block 120 that computes a time domain representation of V. This computation is preferably performed using the inverse Fourier transform to obtain V=TF(V).

At a block 125, the sequence $i_0(n)$ and the vector $V_n$ are then used to calculate a vector $I_n$, which represents the drain current as $I_n = i_0(n) s_\epsilon(V_n)$.

Note that the relationship used to calculate the drain current vector $I_n$ is based upon the characteristic equation of Equation 2, wherein $i_0(n)$ represents the first and second components and $s_\epsilon(V_n)$ represents the third component of Equation 2. The drain current vector, $I_n$, is used in subsequent operations to obtain F(I).

At the same block 125, the vector $\theta_n$, is calculated as shown in Equation 111.

$$\theta_n = \begin{cases} 0 & V_n \geq \epsilon \\ \dfrac{i_0(n)}{\epsilon} & V_n \leq \epsilon \end{cases} \quad (111)$$

The results of block 125 are then provided to the input of a block 130 that uses the values to calculate a current gradient Vector $\phi_q$ as shown according to Equation 113.

$$\phi_q = \frac{1}{M} \sum_{n=0}^{M} \theta_n e^{-\frac{i2\pi q}{M}}, \left(q = 0, 1, \ldots, \frac{M}{2}\right) \quad (113)$$

The vectors $\phi_q$ and $\theta_n$ do not represent physical quantities but are instead used in subsequent operations to calculate a recursion matrix P.

At a block 135, the Fourier transform of the vector I is calculated and used to represent the vector F(I). Note that F(I) represents the calculated value of the drain current that is compared to the estimated value of the drain current I in subsequent operations to determine whether the method has converged.

Prior to checking for convergence, blocks 140 and 145 calculate the recursion matrix P that is subsequently used at a block 150 to determine the estimated value of I for the next iteration, I(m+1). At the block 140 a Jacobian matrix of the function F(I) is calculated according to Equation 115.

$$J_{n,k} = \begin{cases} 0 & k = 0 \text{ or } n = 0 \\ \text{Re}\{(\phi_{k+n} - \phi_{k-n})Z_k\} & 1 \leq k \leq N \text{ and } 1 \leq n \leq N \\ \text{Im}\{-(\phi_{n \cdot N-k} - \phi_{N-n-k})Z_k\} & 1 \leq k \leq N \text{ and } N+1 \leq n \leq 2N \\ \text{Im}\{(\phi_{n+N-k} - \phi_{-N-n-k})Z_{k-N}\} & N+1 \leq k \leq 2N \text{ and } 1 \leq n \leq N \\ \text{Re}\{(\phi_{2N-n-k} - \phi_{n-k})Z_{k-N}\} & N+1 \leq k \leq 2N \text{ and } N+1 \leq n \leq 2n \end{cases} \quad (115)$$

Wherein N represents the number of harmonics to be considered in the simulation. The Jacobian matrix, denoted by J, is used to numerically compute finite differences. More particularly, J relates, in a very precise manner, the way in which small changes in the components of the vector I produce changes in the components of the vector F(I). Thus, J is used to solve for F(I)=I.

The method used in equation 115 to directly compute an analytical representation of J is more computationally efficient than standard methods for computing finite differences. In comparison, standard methods typically employ a numerical Jacobian matrix that is computed by perturbing components of I, then computing F(I), and, lastly, computing numerical differences between I and F(I). Since the function F(I) must be evaluated once for each component of the vector I, the standard methods of computing finite differences are very computationally intensive.

In addition, using an analytical representation of J to compute finite differences between F(I) and I yields superior performance results than do those methods using a numerical Jacobian. Further, precalcuating the vectors $\phi_q$ and $\theta_n$ greatly reduces the computational time required to calculate J. Moreover, the method takes advantage of the symmetry represented by $\phi_{n+M} = \phi_n$ and $\phi_{-n} = \phi^*_n$ so that the matrix elements need only be calculated over the range 0 to M/2.

After the Jacobian matrix has been calculated by block 140, control passes to a block 145 that calculates the recursion matrix P according to equation 117.

$$P = -(J-I)^{-1} \quad (117)$$

Wherein I is the identity matrix.

As will be appreciated by those skilled in the art, using a Jacobian matrix and identity matrix to create a recursion matrix in this fashion is a standard technique, known as Newton's method. The recursion matrix P is subsequently used in later method operations to recursively adapt the estimated value of I to obtain the estimated value for the next iteration, I(m+1).

At block 150, the method updates the present estimate of the drain current to obtain I(m+1) using the Newton method for generating a subsequent I(m) estimate based on a present estimate according to Equation 119.

$$I(m+1)=I(m)+P(F[I(m)]-I(m)) \quad (119)$$

At blocks 155 and 160, the method determines whether the results have converged such that F(I)=I. At this point, heuristics may also be applied to aid in convergence. At the block 155, the parameter η is calculated according to equation 121 to determine whether the method has sufficiently converged.

$$\eta=[F(I)-I]^T \cdot [F(I)-I] \quad (121)$$

In addition, block 155 displays a trace of η as a real time measure of convergence.

At the block 160, if the trace of η demonstrates that convergence is not occurring, either because an incorrect local minima has been found, or because the rate of convergence is prohibitively slow, heuristics are applied to the computation of I(m+1). In the preferred embodiment, equation 119 is modified to include an adjustment factor x according to equation 123.

$$I(m+1)=I(m)+xP(F[I(m)]-I(m)) \quad (123)$$

Under normal circumstances, when convergence is not inhibited, x is equal to one. In contrast, when convergence is inhibited, the value of x is adjusted to release the method from the non-convergent state. One having ordinary skill in the art will appreciate that standard methods are used to adjust x so that convergence is achieved.

In addition, block 160 displays a trace of η as a real time measure of the method convergence. After η is calculated it is compared to a threshold value $\eta_{th}$ at a block 165. If the value of η is less than $\eta_{th}$, then the method has converged and control passes to a block 170. If η does not exceed $\eta_{th}$, indicating that the method has not converged, then control passes to a block 175.

At block 170, the results of the method are assembled for output. At the time of convergence of the method, I and V represent the harmonic components of the drain current and drain to source voltage waveforms respectively. In addition, the inverse Fourier transforms of vectors I and V are computed to yield I and V, the time samples of the drain current and drain to source voltage waveforms, respectively.

In the event of non-convergence, block 175 increments the iteration counter m. Thereafter, control passes to the block 115 where the method repeats steps 115 through 165.

It will be appreciated by those skilled in the art that the ordering of the steps of the method may vary provided that the steps that calculate vectors required for future operations are performed prior to the step that will use the calculated vector. For example, the steps in which the method calculates the estimate of the drain current for the iteration, I(m+1) may be performed after the method has tested for convergence. Similarly, the step that calculates the vector $i_0(n)$ may be performed at any time prior to determination of the vector $I_n$.

Method 2

A second method of the present invention is based upon the fact that a drain current, $i_D(t)$, and a drain voltage, $v_D(t)$, can be calculated if the times at which the transistor enters and exits the nonlinear operating regions are known; and, the times at which the transistor enters and exits the nonlinear operating regions may be calculated if the drain current, $i_D(t)$, is known. Unlike the first method, sampling waveforms is not required and therefore the second method is more computationally efficient than the first method. Moreover, the second method assumes a sinusoidal input waveform.

Figure 5:
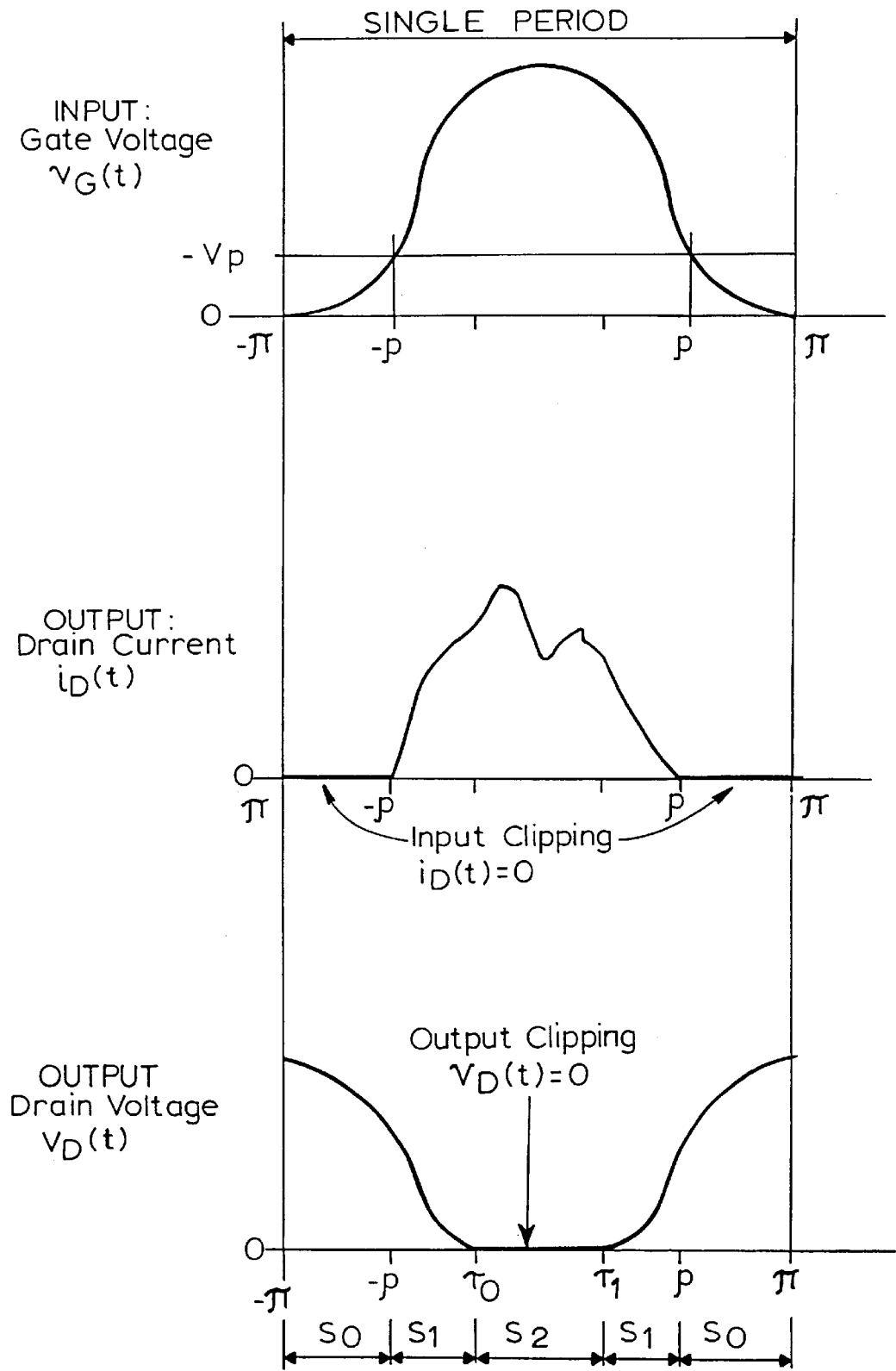
FIG. 5 is a plot of example circuit inputs and outputs in conjunction with the second method of the present invention.

Referring to FIG. 5, the transistor may operate in three different operating regions. A first operating region is designated by $S_0$, and is also referred to as the input clipping region. In the input clipping region, the drain current, $i_D(t)$ is zero. The input clipping region is a region of nonlinear operation. The transistor enters the input clipping region when the gate-to-source voltage, $v_{GS}(t)$, falls below a gate pinch-off voltage, $-V_P$.

A second operating region is designated by $S_1$, and is a region of linear operation. In the linear region, the drain current, $i_D(t)$, is linearly dependent upon the input voltage, $v_{in(t)}$.

A third operating region is designated by $S_2$, and is also referred to as the output clipping region While the transistor is operating in the output clipping region, the drain voltage, $v_D(t)$, is zero. The output clipping region is a region of nonlinear operation.

A value ρ indicates the times at which the transistor operates in the input clipping region. Because the input signal, $v_{in}(t)$, is symmetric about t=0, the value ρ satisfies Equation 200 below.

$$V_{GS}(t) \leq V_P\{t | t \in (-\pi,-\rho) \text{ or } t \in (\rho,\pi)\} \quad (200)$$

The location of ρ and regions of input clipping, $S_0$, are illustrated in FIG. 5.

An output clipping region, $S_2$, is also illustrated in FIG. 5, where the drain voltage, $v_D(t)$, remains zero. The transistor enters the output clipping region at a time $\tau_0$ and exits at a time $\tau_1$.

Figure 6:
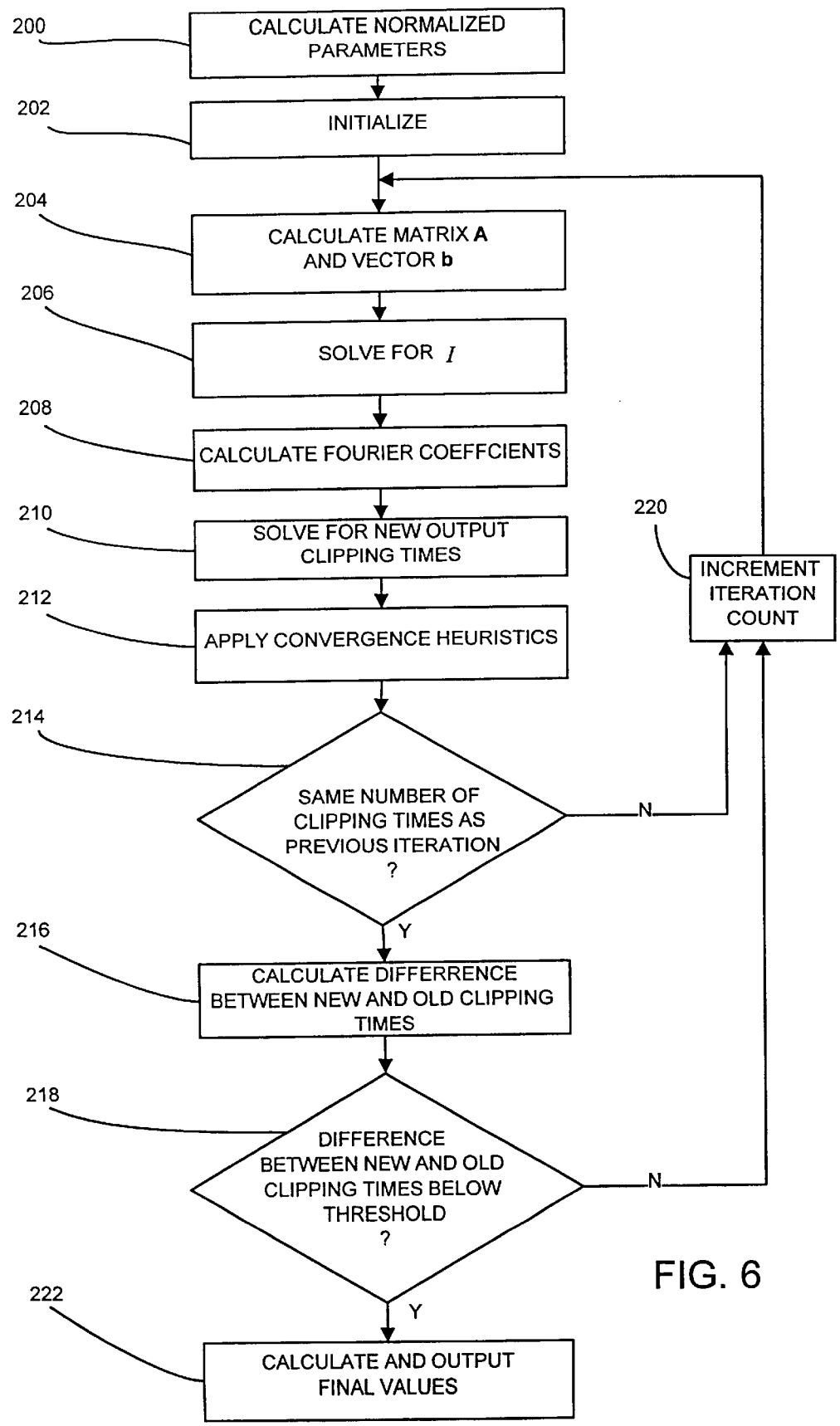
FIG. 6 is a flow diagram representing the second method of the present invention.

Turning now to FIG. 6, there is illustrated a flow diagram of a second method of the present invention. The flow diagram outlines the steps that are performed in determining the nonlinear behavior of a semiconductor amplifier, when the input signal is a sinusoid, i.e. a single tone. The second method assumes an input signal described in Equation 201 below.

$$v_{in}(t)=A\cos(t) \quad (201)$$

The second method employs an iterative technique to calculate time values at which the transistor enters and exits the output clipping region. This iterative technique is equivalent to solving two simultaneous matrix equations. Upon converging to these time values, the second method then calculates the values of the drain current, $i_D(t)$, and the drain voltage, $v_D(t)$.

The second method begins the iterative process by first estimating that the transistor never enters the output clipping region. Based upon this estimate, a value relating to the drain current is calculated. Next, this value is used to calculate a new estimate of time values at which the transistor enters and exits the output clipping region. Using this new estimate of the time values, a new value relating to the drain current is calculated. This process repeats until the method converges to a final result. Based upon this final result, the drain current, $i_D(t)$, and the drain voltage, $v_D(t)$, are calculated.

Note that prior to executing method 2, it is assumed that the following model variables are known;

A=the amplitude of the input sinusoid;

N=the number of arbitrary load impedances specified;

α=the gate voltage to drain current transconductance (A/V);

$V_P$=the gate pinch-ff voltage;

$R_0$=the DC resistance at the drain of the transistor;

$Z_n$=R+jX=the complex impedance at frequency n, specified over the range n=1, 2, . . . , N. For frequencies greater than N, $Z_n$=$R_x$;

$R_x$=the real valued impedance for n>N;

$V_{DD}$=the DC drain bias voltage;

$V_{GG}$=the DC gate bias voltage; and $\eta_{th}$=the threshold value used to determine convergence of method 2.

As previously mentioned, this information may be input to the processor that is executing the second method of the present invention by a number of different methods.

The method begins by passing control to block 200. Block 200 calculates the normalized parameters $\tilde{A}$, $\tilde{V}_{GG}$, and $\rho$, which will be used throughout the method. Parameter $\tilde{A}$ is the normalized amplitude of the input waveform, and is given by Equation 202 below.

$$\tilde{A} = \alpha A \tag{202}$$

Parameter $\tilde{V}_{GG}$ is the normalized DC gate bias voltage, and is given by Equation 203 below.

$$\tilde{V}_{GG} = \alpha[V_P + V_{GG}] \tag{203}$$

The parameter $\rho$ identifies at which times the transistor is in the input clipping operating region, and is given by Equation 204 below.

$$\rho = \begin{cases} 0, & \tilde{A} \leq -(\tilde{V}_{GG}) \\ \cos^{-1}\left(-\frac{\tilde{V}_{GG}}{\tilde{A}}\right) & \tilde{A} \geq |\tilde{V}_{GG}| \\ \pi & \tilde{A} < \tilde{V}_{GG} \end{cases} \tag{204}$$

Given $\rho$, the transistor is in the input clipping operating region for the times indicated by Equation 205 below.

$$\{t | t \in (-\pi, -\rho) \text{ or } t \in (\rho, \pi)\} \tag{205}$$

After computing the parameters $\tilde{A}$, $\tilde{V}_{GG}$ and $\rho$, control passes to the initialization block 202.

Block 202 initializes the method by setting several parameters to zero. More specifically, block 202 initializes the parameters m and $N_\tau(m)$. The parameter m is the iteration number, and it is initialized to the value zero. The parameter m may be modified at a subsequent point in the method. The parameter $N_\tau(m)$ is the size of a vector $\tau$ at time m. The vector $\tau(m)$ contains times at which the transistor enters and exits the output clipping operating region. The method initially assumes that the transistor never enters the output clipping operating region. Therefore, the size of the vector $\tau(m)$ is initialized to zero, as indicated by Equation 207 below.

$$N_\tau(m) = 0 \tag{207}$$

The parameter $N_\tau(m)$ may also be modified at a subsequent point in the method. After parameters m and $N_\tau(m)$ have been initialized, control passes to block 204.

Block 204 is an intermediate step in determining the drain current, $i_D(t)$, based upon the times at which the transistor enters and exits the output clipping region. More specifically, block 204 calculates the components of a matrix A and a vector b, which are both dependent upon the vector $\tau$. Matrix A is an (2N+1)×(2N+1) matrix, whose components are given by Equations 220 through 228 below.

For $n = 0$ and $k = 0$ $$A_{0,0}(\tau) = -\left(\frac{R_x - R_0}{R_x}\right) \sum_{i=0}^{\frac{N_\tau}{2}-1} cc(\tau_{2i}, \tau_{2i+1}, 0, 0) + 2\pi \tag{220}$$

For $1 \leq n \leq N$ and $k = 0$ $$A_{n,0}(\tau) = -\left(\frac{R_x - R_0}{R_x}\right) \sum_{i=0}^{\frac{N_\tau}{2}-1} cc(\tau_{2i}, \tau_{2i+1}, n, 0) \tag{221}$$

For $1 \leq n \leq N$ and $k = n$ $$A_{n,k}(\tau) = -2\left[\left(\frac{R_x - R_k}{R_x}\right) \sum_{i=0}^{\frac{N_\tau}{2}-1} cc(\tau_{2i}, \tau_{2i+1}, n, k) + \left(\frac{X_k}{R_x}\right) \sum_{i=0}^{\frac{N_\tau}{2}-1} cs(\tau_{2i}, \tau_{2i+1}, n, k)\right] + 2\pi \tag{222}$$

For $0 \leq n \leq N$, $i \leq k \leq N$, and $k \neq n$ $$A_{n,k}(\tau) = -2\left[\left(\frac{R_x - R_k}{R_x}\right) \sum_{i=0}^{\frac{N_\tau}{2}-1} cc(\tau_{2i}, \tau_{2i+1}, n, k) + \left(\frac{X_k}{R_x}\right) \sum_{i=0}^{\frac{N_\tau}{2}-1} cs(\tau_{2i}, \tau_{2i+1}, n, k)\right] \tag{223}$$

For $0 \leq n \leq N$ and $N + 1 \leq k \leq 2N$ $$A_{n,k}(\tau) = 2\left[\left(\frac{R_x - R_{k-N}}{R_x}\right) \sum_{i=0}^{\frac{N_\tau}{2}-1} cs(\tau_{2i}, \tau_{2i+1}, n, k - N) + \left(\frac{X_k}{R_x}\right) \sum_{i=0}^{\frac{N_\tau}{2}-1} cc(\tau_{2i}, \tau_{2i+1}, n, k - N)\right] \tag{224}$$

For $N + 1 \leq n \leq 2N$ and $k = 0$ $$A_{n,0}(\tau) = -\left(\frac{R_x - R_0}{R_0}\right) \sum_{i=0}^{\frac{N_\tau}{2}-1} cs(\tau_{2i}, \tau_{2i+1}, 0, n - N) \tag{225}$$

For $N + 1 \leq n \leq 2N$, and $1 \leq k \leq N$ $$A_{n,k}(\tau) = -2\left[\left(\frac{R_x - R_k}{R_x}\right) \sum_{i=0}^{\frac{N_\tau}{2}-1} cs(\tau_{2i}, \tau_{2i+1}, k, n - N) + \left(\frac{X_k}{R_x}\right) \sum_{i=0}^{\frac{N_\tau}{2}-1} ss(\tau_{2i}, \tau_{2i+1}, n - N, k)\right] \tag{226}$$

For $N + 1 \leq n \leq 2N$ and $k \leq N$ $$A_{n,k}(\tau) = 2\left[\left(\frac{R_x - R_{n-N}}{R_x}\right) \sum_{i=0}^{\frac{N_\tau}{2}-1} ss(\tau_{2i}, \tau_{2i+1}, n - N, n - N) - \left(\frac{X_{k-N}}{R_x}\right) \sum_{i=0}^{\frac{N_\tau}{2}-1} cs(\tau_{2i}, \tau_{2i+1}, n - N, n - N)\right] - 2\pi \tag{227}$$

For $N + 1 \leq n \leq 2N$, $N + 1 \leq k \leq -2N$, $k \neq n$ $$A_{n,k}(\tau) = 2\left[\left(\frac{R_x - R_{k-N}}{R_x}\right)\sum_{i=0}^{\frac{N_\tau}{2}-1} ss(\tau_{2i}, \tau_{2i+1}, n-N, k-N) - \right.$$
$$\left.\left(\frac{X_{k-N}}{R_x}\right)\sum_{i=0}^{\frac{N_\tau}{2}-1} cs(\tau_{2i}, \tau_{2i+1}, k-N, n-N)\right] \quad (228)$$

Equations 220 through 228 reference trigonometric functions cc, cs, and ss, These functions are defined by Equations 230 through 232 below.

$$cc(\tau_a, \tau_b, n, k) = \quad (230)$$
$$\begin{cases} \tau_b - \tau_a & n=0 \text{ and } k=0 \\ \frac{1}{2}\left[\tau_b - \tau_a + \frac{\sin(n\tau_b)\cos(n\tau_b) - \sin(n\tau_a)\cos(n\tau_a)}{n}\right] & n=k \text{ and } n \neq 0 \\ \frac{k\sin(k\tau_b)\cos(n\tau_b) - n\cos(k\tau_b)\sin(n\tau_b) - k\sin(k\tau_a)\cos(n\tau_a) + n\cos(k\tau_a)\sin(n\tau_a)}{k^2 - n^2} & n \neq k \end{cases}$$

$$ss(\tau_a, \tau_b, n, k) = \quad (231)$$
$$\begin{cases} 0 & n=0 \text{ and } k=0 \\ \frac{1}{2}\left[\tau_b - \tau_a + \frac{\sin(n\tau_a)\sin(n\tau_a) - \sin(n\tau_b)\sin(n\tau_b)}{n}\right] & n=k \text{ and } n \neq 0 \\ \frac{k\sin(n\tau_b)\cos(k\tau_b) - n\cos(n\tau_b)\sin(k\tau_b) - k\sin(n\tau_a)\cos(k\tau_a) + n\cos(n\tau_a)\sin(k\tau_a)}{n^2 - k^2} & n \neq k \end{cases}$$

$$cs(\tau_a, \tau_b, n, k) = \quad (232)$$
$$\begin{cases} 0 & n=0 \text{ and } k=0 \\ \frac{\cos^2(n\tau_a) - \cos^2(n\tau_b)}{2n} & n=k \text{ and } n \neq 0 \\ \frac{k\cos(n\tau_b)\cos(k\tau_b) + n\sin(n\tau_b)\sin(k\tau_b) - k\cos(n\tau_a)\cos(k\tau_a) + n\sin(n\tau_a)\sin(k\tau_a)}{n^2 - k^2} & n \neq k \end{cases}$$

The vector b is a (2N+1) dimensional vector, whose components are given by Equations 240 through 243 below.

For $0 \leq n \leq N$, $N_\tau = 0$ (240)

$$b_n(\tau) = \tilde{V}_{GG}[cc(-\rho,\rho,n,0)] + \tilde{A}[cc[(-\rho,\rho,n,1)]$$

For $0 \leq n \leq N$, and $N_\tau \neq 0$ $$b_n(\tau) = \tilde{V}_{GG}\left[cc(-\rho, \tau_0, n, 0) + cc(\tau_{N_1-i}, \rho, n, 0) + \sum_{i=1}^{\frac{N_\tau}{2}-1} cc(\tau_{2i-i}, \tau_{2i}, n, 0)\right] + \tilde{A}\left[cc(-\rho, \tau_0, n, 1) + cc(\tau_{N_\tau-i}, \rho, n, 1) + \sum_{i=1}^{\frac{N_\tau}{2}-1} cc(\tau_{2i-1}, \tau_{2i}, n, 1)\right] + \frac{V_{DD}}{R_X}\left[\sum_{i=0}^{\frac{N_\tau}{2}-1} cc(\tau_{2i}, \tau_{2i+1}, n, 0)\right] \quad (241)$$

For $N+1 \leq n \leq 2N$, and $N_\tau = 0$  $b_n(\tau) = 0$ (242)

For $N+1 \leq n \leq 2N$, and $N_\tau \neq 0$ $$b_n(\tau) = \tilde{V}_{GG}\left[cs(-\rho, \tau_0, n, 0) + cs(\tau_{N_1-i}, \rho, n, 0) + \sum_{i=1}^{\frac{N_\tau}{2}-1} cs(\tau_{2i-i}, \tau_{2i}, n, 0)\right] + \tilde{A}\left[cs(-\rho, \tau_0, n, 1) + cs(\tau_{N_\tau-i}, \rho, n, 0) + \sum_{i=1}^{\frac{N_\tau}{2}-1} cs(\tau_{2i-1}, \tau_{2i}, n, 1)\right] + \frac{V_{DD}}{R_X}\left[\sum_{i=0}^{\frac{N_\tau}{2}-1} cs(\tau_{2i}, \tau_{2i+1}, n, 0)\right] \quad (243)$$

Equations 240 through 243 reference the trigonometric functions cc and cs. These functions are defined by Equations 230 and 232 above. After the components of A and b have been computed, they are passed to block 206. Additionally, control passes to block 206.

Block 206 generates a vector I, which is an intermediate result in determining the drain current, $I_D(t)$. More specifically, block 206 generates the vector I using the matrix A and the vector b which were generated previously in block 204. The vector I is generated by solving the matrix Equation 245 below (or if a solution does not exist, finding an approximate solution).

$$AI = b \quad (245)$$

Numerous techniques for solving an equation in the form of Equation 245 are known to those skilled in the art. In the present embodiment, I is generated from matrix A and vector b using singular value decomposition. However, other commonly used techniques such as Gauss-Jordan Elimination, LU Decomposition, or QR Decomposition, may also be used. The components of the vector I will be referred to as $I_0, I_1, \ldots I_{2n}$. After block 206 has generated I, control passes to block 208.

Block 208 is an intermediate step in determining new values of the times at which the transistor enters and exits the output clipping operating region, based upon the result obtained in block 206 above. More specifically, block 208 is an intermediate step in determining a new vector $\tau(m+1)$ based upon the new vector I calculated in block 206 above. Block 208 computes the Fourier coefficients $a_0, a_1, \ldots a_N$ and $b_1, b_2, \ldots b_N$. Coefficients $a_0, a_1, \ldots a_N$ are computed using Equations 250 through 252 below.

$$a_0 = V_{DD} + (R_x - R_0)I_0 - R_x \tilde{V}_{GG} \qquad (250)$$

$$a_1 = (R_x - R_1)I_1 + X_1 I_{1+N} - \frac{\tilde{A} R_x}{2} \qquad (251)$$

$$a_n = (R_x - R_n)I_n + X_n I_{n+N} \quad (n = 2, 3, \ldots, N) \qquad (252)$$

Coefficients $b_1, b_2, \ldots b_N$ are computed using Equation 253 below.

$$b_n = X_n I_n - (R_x R_n) I_{n+N} \quad (n=1,2,\ldots,N) \qquad (253)$$

After these coefficients are computed, they, along with control, are passed to block 210.

Block 210 calculates new values of the times at which the transistor enters and exits the output clipping operating region based upon the results of block 208 above. More specifically, block 210 solves for a new vector $\tau(m+1)$ and its size $N\tau(m+1)$, based upon the coefficients $a_0, a_1, \ldots a_N$ and $b_1, b_2, \ldots b_N$ computed in block 208 above. The new vector $\tau(m+1)$ and its size $N_\tau(m+1)$ are computed in several steps.

First, a function $q(t)$ is computed according to Equation 260 below. Equation 260 essentially describes a Fourier Series.

$$q(t) = a_0 + \sum_{n=1}^{N} a_n \cos(nt) + b_n \sin(nt) \qquad (260)$$

This function, $q(t)$, is a $2n$-periodic function. Next, Equation 261 below is solved, which essentially is the computation of the zeros of a Fourier Series. Methods of solving this equation are well known in the art.

$$q(t)=0, \text{ for } (-\pi \leq t < \pi) \qquad (261)$$

Finally, the solution to Equation 261 yields $N_\tau(m+1)$ and the components of $\tau(m+1)$. The value $N_\tau(m+1)$ is the number of solutions to Equation 261. The solutions to Equation 261 are the components of the new vector $\tau(m+1)$ arranged as specified by Equations 262 and 263 below.

$$-\pi \leq \tau_0 \leq \tau_1 \leq \ldots \leq \tau_{N_\tau - 1} \leq \pi \qquad (262)$$

$$(t) < 0 \text{ for } t \in (\tau_{2i}, \tau_{2i+1}) \quad \left(i = 0, \ldots, \frac{N_\tau}{2} - 1\right) \qquad (263)$$

After computation of $\tau(m+1)$ and $N_\tau(m+1)$, control passes to block 212.

In block 212, the method applies heuristics to aid the convergence of the output clipping times and to prevent the algorithm from oscillating in an infinite loop. More specifically, the heuristics compare $N_\tau(m+1)$ computed in block 210 with $N_\tau$ calculated in previous iterations in order to determine whether the algorithm is oscillating. If the algorithm is oscillating, the heuristics adjust the output clipping times in $\tau(m)$. A C software implementation of the block 212 heuristics are attached in Appendix A. In practice, oscillation of the algorithm rarely occurs, and modification of $\tau(m+1)$ by the block 212 is not normally required. After the heuristics have been applied, control passes to block 214.

Block 214 is a first step in a two-step test to determine whether the method has converged, i.e. a two-step convergence test. Basically, block 214 determines whether, during the current iteration, the method computed a different number of times at which the transistor entered into the output clipping region, as compared to the previous iteration. More specifically, the method compares the values of $N_\tau(m)$ and $N_\tau(m+1)$. If they are different, the method has not yet converged, and control passes to block 220. If the values of $N_\tau(m)$ and $N_\tau(m+1)$ are the same, control passes to block 216 in order to perform the second step of the two-step convergence test.

Block 216 calculates a measure of difference between the results of the current iteration and the results of the previous iteration. More specifically, block 216 calculates a measure of the difference between the vectors $\tau(m)$ and $\tau(m+1)$ using Equation 270 below.

$$\eta = \sum_{i=0}^{N_\tau - 1} [\tau_i(m+1) - \tau_i(m)]^2 \qquad (270)$$

$\eta$ is a measure of the difference between vectors $\tau(m)$ and $\tau(m+1)$. After block 216 computes $\eta$, $\eta$ as well as control are passed to block 218.

Block 218 completes the second step of the two-step convergence test. Block 218 determines whether the results of the current iteration are similar enough to the results of the past iteration in order to consider the method converged. More specifically, block 218 compares $\eta$ with a threshold value $\eta_{th}$. If $\eta$ is greater than or equal to $\eta_{th}$, then the method has not yet converged, and control passes to block 220. However, if $\eta$ is less than $\eta_{th}$, then the method has converged, and control passes to block 222 in order to compute the final results.

When control passes to block 220, the method has not yet converged. Block 220 prepares the method for the next iteration. More specifically, the iteration number m is updated according to Equation 280 below.

$$m = m+1 \qquad (280)$$

After m has been updated, control passes to block 204, where the next iteration of the method begins.

When control passes to block 222, the method has converged. Block 222 calculates the drain current, $i_D(t)$, and the drain voltage, $v_D(t)$, based upon intermediate results calculated during the last iteration. More specifically, the drain current and voltage are calculated using the vector I calculated in block 206, as well as other parameters.

The drain current and voltage exhibit different behaviors depending upon the operating region in which the transistor is operating. As mentioned previously, the transistor is assumed to operate in three distinct operating regions: the input clipping region, the linear region, and the output clipping region. These three regions are defined by Equations 290, 291, and 292 below, where $S_0$ is the input clipping region, $S_1$ is the linear region, and $S_2$ is the output clipping region.

$$S_0 = \{t | t \in (\rho, \pi), \text{ or } t \in (-\pi, -\rho)\} \qquad (290)$$

$$S_1 = \Big\{ t | t \in (-\rho, \tau_0), \text{ or } t \in (\tau_{N_i-1}, \rho), \qquad (291)$$
$$\text{or } t \in (\tau_{2i-1}, \tau_2 i) \text{ for some } i \in \left[1, \frac{N_\tau}{2} - 1\right]\Big\}$$

$$S_2 = \left\{ t \mid t \in (\tau_{2i}, \tau_{2i+1}), \text{ for some } i \in \left[0, \frac{N_\tau}{2} - 1\right] \right\} \quad (292)$$

The drain current, $i_D(t)$, and the drain voltage, $v_D(t)$, are calculated in the three operating regions as specified by Equations 295 and 296 below. The values of I are obtained from block 206.

$$v_D(t) = \quad (295)$$

$$\begin{cases} V_{DD} + (R_x - R_0)I_0 + 2\text{Re}\left\{\sum_{i=1}^{N}(R_x - Z_n)(I_n + jI_{n+N})e^{jnt}\right\} & t \in S_0 \\ V_{DD} + (R_x - R_0)I_0 + 2\text{Re}\left\{\sum_{i=1}^{N}(R_x - Z_n)(I_n + jI_{n+N})e^{jnt}\right\} - & t \in S_1 \\ \quad R_x[\tilde{V}_{GG} + \tilde{A}\cos(t)] & \\ 0 & t \in S_2 \end{cases}$$

$$i_D(t) = \quad (296)$$

$$\begin{cases} 0 & t \in S_0 \\ \tilde{V}_{GG} + \tilde{A}\cos(t) & t \in S_1 \\ \frac{V_{DD}}{R_X} + \left(\frac{R_x - R_0}{R_x}\right)I_0 + 2\text{Re}\left\{\sum_{i=1}^{N}\left(\frac{R_x - Z_n}{R_x}\right)(I_n + jI_{n+N})e^{jnt}\right\} & t \in S_2 \end{cases}$$

It will be appreciated by those skilled in the art that the ordering of the steps of the method may vary provided the steps that calculate values required for future operations are performed prior to the step that will use the calculated value.

Method 3

Method three, like method two, uses the input and output clipping points of the transistor to determine the drain current, drain to source voltage and output current of the transistor. The C code to perform this method in its preferred embodiment is attached as Appendix B in the microfiche appendix. According to the present invention, mathematical representations of arbitrary periodic waveforms are input to the model amplifier of FIG. 2. The mathematical representation of the input waveform is analyzed to determine the times at which the waveform amplitude exceeds a set of predetermined thresholds. The times when the thresholds are exceeded are commonly referred to as clipping points. The input waveform is given by specifying its harmonic components. In addition the attached C code implementation allows the specification or threshold values for which the input waveform clips. This is a convenient way to specify a clipped waveform shape at the input without having to specify a large number of harmonics at the input. This demonstrates the ability of the algorithm to treat arbitrary periodic input waveforms and should not limit the scope of this invention to waveforms only of this form.

Figure 7:
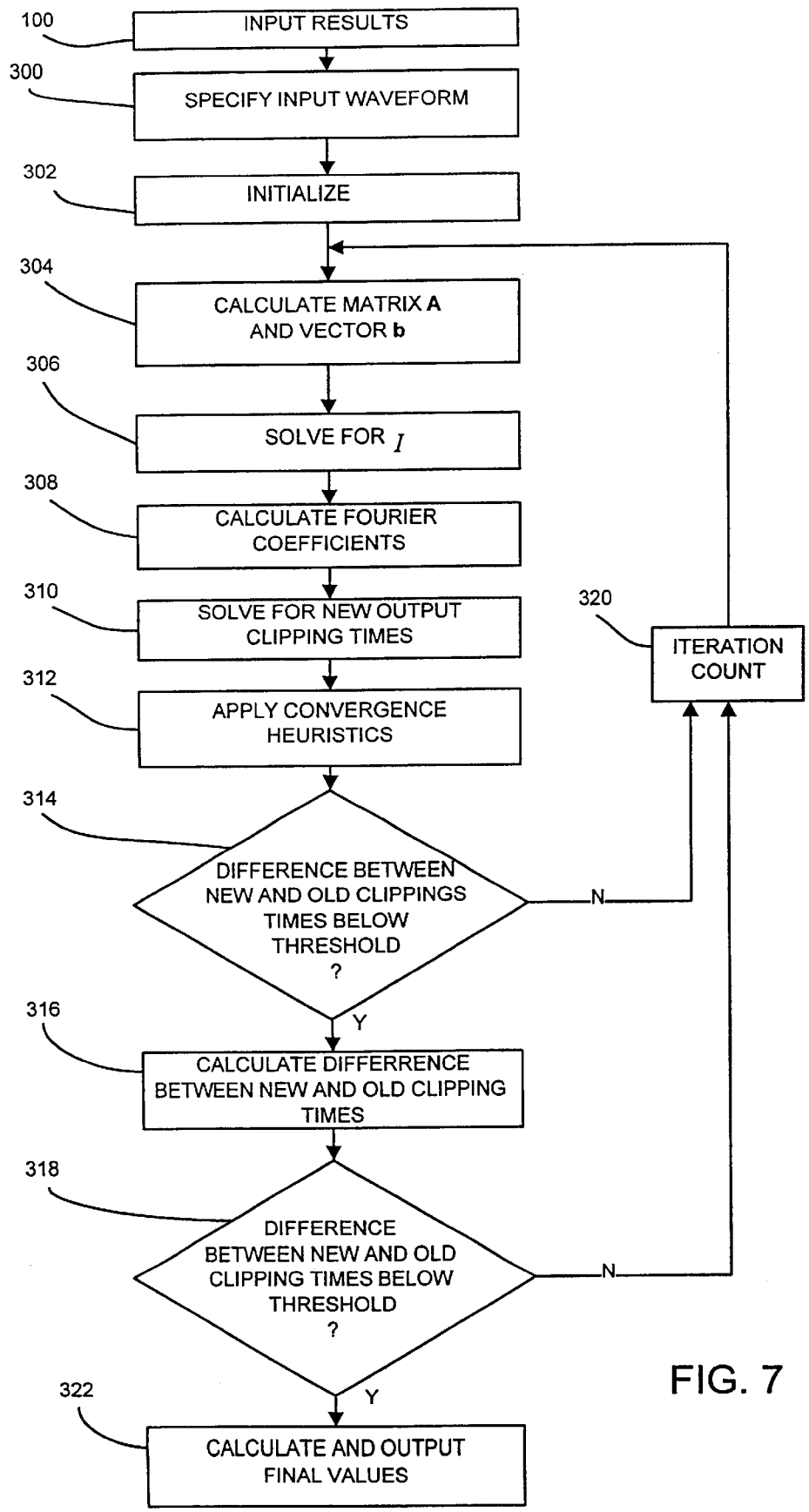
FIG. 7 is a flow diagram representing the third method of the present invention.

Referring now to FIG. 7, method three begins at a block 300 that calculates the values in time when the amplitude of the arbitrary input waveform $v_G(t)$ is equal to:

$V_{gmin}$, the lower threshold limit of the input/gate waveform $v_G(t)$;

$V_{gmax}$, the upper threshold limit of input/gate waveform $v_G(t)$; or $-V_P$, the gate pinch off voltage.

Figure 8A:
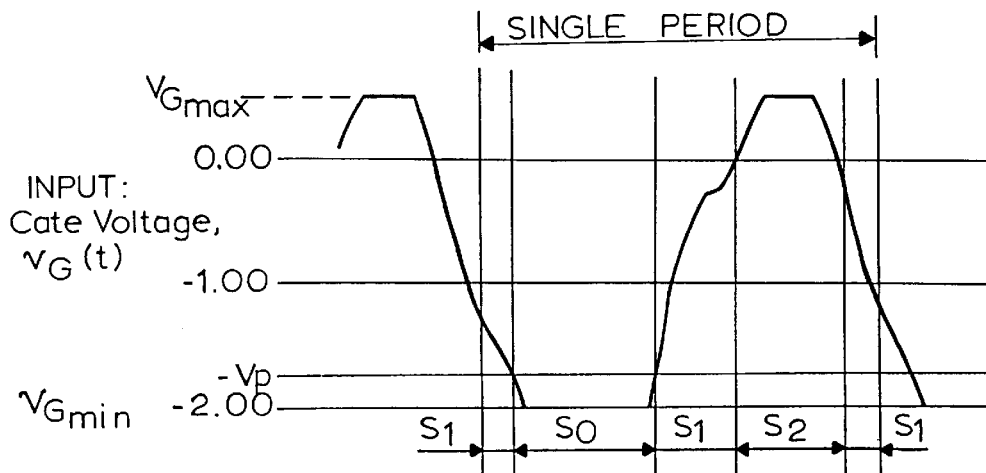
FIG. 8 is a plot of example circuit inputs and outputs in conjunction with the third method of the present invention.
Figure 8B:
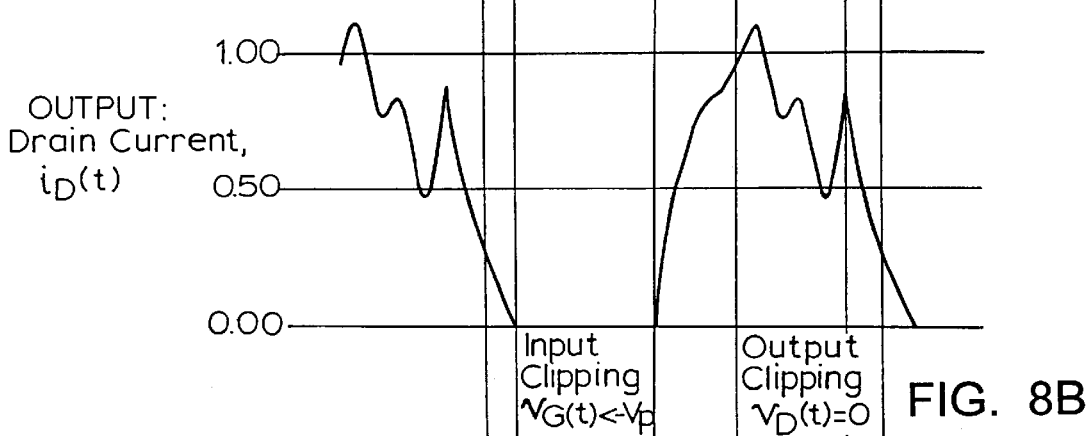
Figure 8C:
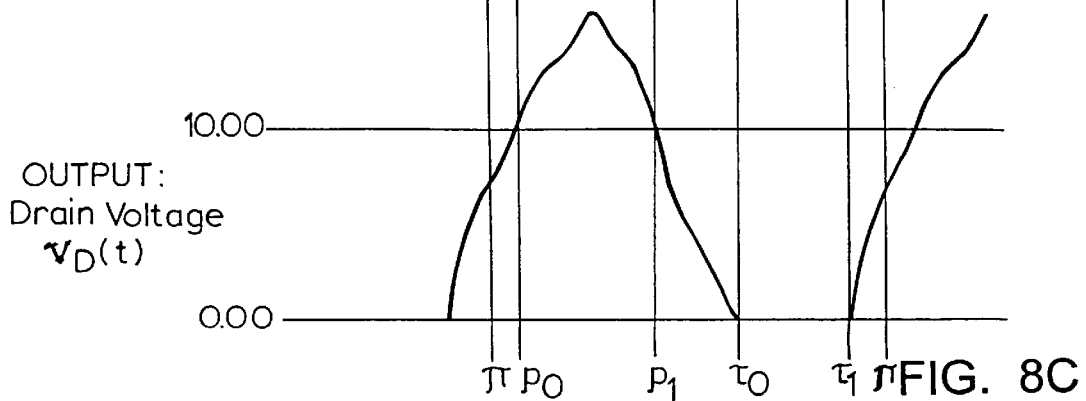

Note that the values for $-V_P$, $V_{gmin}$, $V_{gmax}$ are input to the processor 50 prior to starting the method. Note also that, as shown in FIG. 8, the input waveform is periodic so that the input waveform can be analyzed over a single period to determine all necessary information about the input waveform. The times that output clipping occurs are subsequently stored as a vector $\tau$, where the values of the vector are represented by $\tau_0, \tau_1, \ldots, \tau_N$. The times that input clipping occur are stored in a vector $\rho_0, \rho_1, \ldots, \rho_{N_\rho-1}$. The values of the $\rho$'s are the times when the input waveform falls below the threshold value $-V\rho$.

Next, control passes to a block 302 that sets an iteration counter m to zero. A vector t(m) is defined to contain the times at which the transistor output voltage clips. Initially, it is assumed that the transistor output has not clipped so that the vector t(m) is set to zero Additionally, a variable $N_\tau(0)$ that represents the size of the vector t at time m, is set to zero. Thereafter, control passes to a block 304.

Block 304 calculates the matrix A and the vector b. Matrix A is calculated according to the same procedure used at block 204 of Method 2. The vector b is also calculated in a manner similar to that used in Method 2. However, the calculation of b is more computationally intensive than the b calculation used in conjunction with method two.

Next, matrix A and vector b are passed to a block 306, which calculates the matrix I according to Equation 350.

$$AI=b \quad (350)$$

A highly accurate estimate of the solution is made using several well known mathematical approximation techniques. In this embodiment, a Single Value Decomposition method is used to minimize the norm of the difference vector AI−b to approximate the solution. The method of accomplished using a C-coded subroutine. Other commonly used methods that are well known to those practiced in the art are Gauss-Jordan Elimination, LU Decomposition, and QR Decomposition. The components of the resulting vector I are referred to as $I_0, I_1, \ldots I_{2N}$.

After block 306 calculates the components of I, control passes to a block 308. Block 308 calculates the values of the fast fourier coefficients, $a_0$ through $a_n$ and $b_0$ through $b_n$ using I. The coefficient $a_0$ is calculated according to Equation 352.

$$a_0 = V_{DD} + (R_x - R_0)I_0 \quad (352)$$

Wherein, $V_{DD}$, is the DC drain bias voltage (measured in volts), $R_x$ is the real valued impedance for frequencies n>N, $R_0$ is the DC resistance at the drain of the transistor (measured in Ohms), and $I_D$ is the first component of the vector I calculated by block 306.

The values for $a_1$ through $a_n$ are calculated according to Equation 354.

$$a_n = (R_n - R_n)I_n + X_n I_{n+N} \quad (n=1,2,\ldots,N) \quad (354)$$

Wherein $R_n$ and $X_n$ are the resistance and the reactance of the transistor at harmonic n, $I_{n+N}$ is the component n+N of the vector I, and $I_n$ is the nth component of the vector I.

The coefficients $b_1$ through $b_n$ are calculated using Equation 356.

$$b_n = X_n I_n - (R_n - R_n)I_{n+N} \quad (n=1,2,\ldots,N) \quad (356)$$

Control then passes to a block 310.

Block 310 uses the coefficients at a block 308 to calculate a periodic Fourier Series q(t) as shown by Equation 358.

$$q(t) = a_0 + \sum_{n=1}^{N} a_n \cos(nt) + b_n \sin(nt) \qquad (358)$$

Block 310 then solves for the roots of Equation 360.

$$q(t) - \alpha R_x [V_{P+v_G}(t)] = 0, \text{ for } (-\pi \leq t < \pi) \qquad (360)$$

Wherein α is the gate voltage to drain current transductance (amps/volt), $V_P$ is the gate pinch off voltage (in volts) and $v_G(t)$ is the volts of the input voltage waveform at time t.

The roots of Equation 360 are denoted by $T_x(m+1)$ and represent predictions or estimates as when output clipping will occur. The number of solutions to Equation 360 is represented by $N_\tau(m+1)$. These solutions are then sorted, in ascending order from −n to +n. Control then passes to a block 312.

In block 312, heuristics are applied to aid the convergence if the method is not converging due to the detection of an incorrect local minimum or because convergence is prohibitively slow. Once the heuristics have been applied, method control then flows to block 314.

At block 314, the $N_\tau(m+1)$ is compared to $N_\tau(m)$. If the terms are equal, indicating that the number of clipping points found in the m+1 iteration, $N_\tau(m+1)$, is the same as the number of clipping points found in the previous iteration, m, control passes to a block 316. If the number of clipping points found in each iteration are not equal, then control passes to a block 320 steps 304 through 314 are repeated.

At the block 316, the method calculates η according to the following formula:

$$\eta = \sum_{i=0}^{N_\tau - 1} [\tau_i(m-1) - \tau_i(m)]^2 \qquad (362)$$

The variable η represents the sum of the squares of the difference between the solutions of Equation 360 ($\tau_i(m+1)$) to the solutions found in the previous iteration in this iteration $\tau_i(m)$. Control then passes t a block 318.

In block 318, the method compares the value of η calculated in Equation 362 at block 316 to a known threshold value, $\eta_{TH}$. If η exceeds $\eta_{TH}$ indicating that convergence has not occurred, then control proceeds to block 320. If η is less than $\eta_{TH}$, then convergence has occurred and control passes to a block 322.

At block 320, the increment counter variable in is incremented by one and thereafter control proceeds to a lock 304.

At block 322, to calculate the desired current and voltage waveforms for each distinct region of transistor operation, Equations 364–374 are used as shown below. For the input clipping region $v_D(t)$ and $I_D(t)$ are calculated as follows:

$$v_D(t) = V_{DD} + (R_x - R_0)I_0 + 2Re\left\{\sum_{i=1}^{N}(R_x - Z_n)(I_n + jI_{n+N})e^{jnt}\right\} \qquad (364)$$

In the linear region, $V_D(t)$ and $i_D(t)$ are calculated as follows:

$$v_D(t) = V_{DD} + (R_x - R_0)I_0 + \qquad (368)$$
$$2Re\left\{\sum_{i=1}^{N}(R_x - Z_n)(I_n + jI_{n+N})e^{jnt}\right\} - R_x\alpha[V_P + v_G(t)]$$

$$i_D(t) = \alpha[V_P + v_G(t)] \qquad (370)$$

In the output clipping region, $$v_D(t) = 0 \qquad (372)$$

and $i_D(t)$ is calculated as follows:

$$i_D(t) = \qquad (374)$$
$$\left(\frac{V_{DD}}{R_x}\right) + \left(\frac{(R_x - R_0)}{R_x}\right)I_0 + 2Re\left\{\sum_{i=1}^{N}\left(\frac{(R_x - Z_n)}{R_x}\right)(I_n + jI_{n+N})e^{jnt}\right\}$$

Of course, it should be understood that a range of changes and modifications can be made to the preferred embodiment described above. For example, transistor parasitic elements, such as drain-to-source capacitance or drain resistance, can be incorporated into the transistor model by defining the equivalent load impedances seen by the transistor. It is therefore intended that the foregoing detailed description be regarded as illustrative rather than limiting and that it be understood that it is the following claims, including all equivalents, which are intended to define the scope of this invention.

What is claimed is:

1. A method for designing an amplifier circuit having a transistor having known circuit characteristics, the method comprising the steps of:
   modeling the transistor circuit by,
   (a) inputting into a processor a known transistor circuit input value;
   (b) sampling a gate-to-source voltage from the known circuit input value to obtain sample voltage values;
   (c) estimating an initial drain current having frequency components in response to the sample voltage values;
   (d) generating a drain-to-source voltage vector having frequency components in response to the frequency components of the initial drain current vector;
   (e) generating an initial time domain vector of the drain current from the frequency components of the drain-to-source voltage;
   (f) determining a time domain drain-to-source voltage at least in part by performing an inverse FFT of the frequency components of the drain-to-source voltage;
   (g) generating a current gradient vector having gradient frequency components as a function of the sample voltage values and the initial time domain vector of the drain current;
   (h) generating a recursion matrix in response to the gradient frequency components;
   (i) performing a fast Fourier transform of the initial time domain vector of the drain current;
   (j) computing an analytical representation of a Jacobian matrix of an initial output value using the time domain vector of the drain current;
   (k) updating the initial drain current vector estimate using the recursion matrix to obtain an updated current vector;
   (l) calculating a convergence factor based on a difference between the updated drain current vector and the initial drain current vector;
   (m) displaying the convergence factor;
   (n) testing the convergence factor to determine whether the initial drain current vector and the updated drain current estimate vector have converged;
   (o) repeating steps of (c) through (n) until the updated drain current and the initial drain current have converged;

(p) when the updated drain current vector and the initial drain current vector have converged, performing an inverse fast Fourier transform of the drain current vector and the drain-to-source voltage;

(q) calculating a final drain current and a final drain-to-source voltage of the transistor circuit in response to the updated drain current vector and the time domain drain-to source voltage;

(r) displaying on an output device the final drain-to-source voltage and the final drain current to form a transistor model; and designing and testing the amplifier circuit in response to the transistor model.

2. The method as recited in claim 1 further comprising the steps of applying heuristics to said drain current vector.

3. The method as recited in claim 1 wherein said known input circuit value comprises a periodic arbitrary waveform.

4. The method as recited in claim 1 wherein said known input circuit value comprises a periodic arbitrary waveform.

5. A method for designing an amplifier circuit having a transistor having known circuit characteristics, the method comprising the steps of:

modeling the transistor circuit by, (a) inputting into a processor a known transistor circuit input value;

(b) estimating an initial drain current so that the transistor does not enter a clipping region;

(c) calculating a first set of time values of when the transistor enters the clipping region in response to the initial drain current;

(d) generating a first matrix in response to the first set of time values;

(e) generating a first vector in response to the first set of time values;

(f) determining a first drain current vector in response to the first matrix and the first vector;

(g) determining a first set of Fourier coefficients of the first drain current vector;

(h) generating a second set of time values after the first set of time values;

(i) generating a second matrix and a second vector in response to the second set of time values;

(j) determining a second drain current vector in response to the second matrix and the second vector;

(k) determining a second set of Fourier coefficients of the second drain current vector;

(l) calculating a convergence factor based on a difference between the first set of time values and the second set of time values;

(m) testing the convergence factor to determine whether the first set of time factors and the second set of time factors have converged;

(n) updating an output value estimate using the second drain current vector;

(o) substituting the first set of time values with the second set of time values and recalculating the second set of time values in steps (d) to (n), until the first set of time values and the second set of time values have converged;

(p) calculating a drain current and drain voltage in response to the second drain current vector of said transistor;

(q) displaying on an output device the drain current and drain voltage of the transistor circuit to form a transistor model; and (r) displaying on an output device the final drain-to-source voltage and the final drain current to form a transistor model; and designing and testing the amplifier circuit in response to the transistor model.

6. The method as recited in claim 5 wherein said first set of time values correspond to a non-linear operating region of the transistor circuit.

7. The method as recited in claim 5 wherein said first set of time values correspond to clipping points of non-linear operating region of the transistor circuit.

8. The method as recited in claim 5 wherein said known input circuit value comprises a periodic arbitrary waveform.

\* \* \* \* \*